(12) United States Patent
Elgar et al.

(10) Patent No.: US 7,470,919 B2
(45) Date of Patent: Dec. 30, 2008

(54) SUBSTRATE SUPPORT ASSEMBLY WITH THERMAL ISOLATING PLATE

(75) Inventors: Yacov Elgar, Sunnyvale, CA (US); Patrick D. Duane, Castro Valley, CA (US); William Eckes, Castro Valley, CA (US); Rushford Ogden, Daly City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 263 days.

(21) Appl. No.: 11/537,163

(22) Filed: Sep. 29, 2006

(65) Prior Publication Data
US 2007/0157886 A1 Jul. 12, 2007

Related U.S. Application Data

(60) Provisional application No. 60/722,127, filed on Sep. 30, 2005.

(51) Int. Cl.
*C23C 16/00* (2006.01)
*C23F 1/00* (2006.01)
*H01L 21/00* (2006.01)

(52) U.S. Cl. ............ 250/492.1; 250/491.1; 250/492.2; 250/492.3; 118/725; 118/728; 118/729; 156/345.51; 134/1; 134/1.3; 134/32

(58) Field of Classification Search ............. 250/491.1, 250/492.1, 492.2, 492.3; 118/719, 728, 729, 118/725; 156/345.54, 345.51, 345.52, 345.53, 156/345.55, 345.5; 134/1, 1.1, 1.2, 1.3, 32; 414/217, 333.01, 935
See application file for complete search history.

(56) References Cited

U.S. PATENT DOCUMENTS

| 5,738,165 | A | * | 4/1998 | Imai | ...................... | 165/80.2 |
|---|---|---|---|---|---|---|
| 6,350,320 | B1 | * | 2/2002 | Sherstinsky et al. | ......... | 118/715 |
| 6,394,797 | B1 | * | 5/2002 | Sugaya et al. | ............... | 432/253 |
| 6,544,340 | B2 | * | 4/2003 | Yudovsky | ................... | 118/728 |
| 6,558,509 | B2 | * | 5/2003 | Kraus et al. | ............ | 156/345.54 |
| 6,645,344 | B2 | * | 11/2003 | Caldwell et al. | ........ | 156/345.53 |
| 6,765,647 | B1 | * | 7/2004 | Nishi | .......................... | 355/55 |
| 6,846,149 | B2 | * | 1/2005 | Savage et al. | .......... | 414/416.03 |
| 6,857,838 | B2 | * | 2/2005 | Kuroda | ................... | 414/331.01 |
| 6,932,871 | B2 | * | 8/2005 | Chang et al. | ................ | 118/719 |
| 7,129,694 | B2 | | 10/2006 | Brunner et al. | | |
| 7,357,842 | B2 | * | 4/2008 | Ishikawa et al. | ............ | 118/503 |
| 2001/0010950 | A1 | * | 8/2001 | Savage et al. | ............... | 438/124 |
| 2002/0033136 | A1 | * | 3/2002 | Savage et al. | ............... | 118/719 |
| 2002/0069820 | A1 | * | 6/2002 | Yudovsky | ................... | 118/500 |
| 2002/0172764 | A1 | * | 11/2002 | Caldwell et al. | ......... | 427/248.1 |
| 2002/0189940 | A1 | * | 12/2002 | Tsai et al. | ............. | 204/298.15 |
| 2003/0010292 | A1 | * | 1/2003 | Kholodenko et al. | ........ | 118/728 |
| 2003/0180127 | A1 | * | 9/2003 | Kuroda | ...................... | 414/217 |
| 2003/0194493 | A1 | * | 10/2003 | Chang et al. | ............. | 427/248.1 |
| 2004/0025791 | A1 | * | 2/2004 | Chen et al. | .................. | 118/728 |

(Continued)

*Primary Examiner*—Bernard E Souw
(74) *Attorney, Agent, or Firm*—Patterson & Sheridan LLP (57) ABSTRACT

Embodiments of the invention generally provide a substrate support assembly. In one embodiment, a substrate support assembly includes a substrate support plate, a thermal regulating plate coupled in a spaced-apart relation to the substrate support plate and a main actuator coupled in a spaced-apart relation to the thermal regulating plate. The main actuator is adapted to move the substrate support plate laterally. The substrate support assembly is configured to limit the thermal influence of the main actuator on a substrate positioned on the substrate support plate.

20 Claims, 5 Drawing Sheets

U.S. PATENT DOCUMENTS

| | | | |
|---|---|---|---|
| 2004/0037676 A1* | 2/2004 | Harris et al. | 414/217 |
| 2005/0134834 A1* | 6/2005 | Davis et al. | 356/72 |
| 2005/0178402 A1* | 8/2005 | Stowell et al. | 134/1.3 |
| 2005/0184256 A1* | 8/2005 | Chauhan et al. | 250/492.22 |
| 2005/0185562 A1* | 8/2005 | Chauhan et al. | 369/101 |
| 2005/0205110 A1* | 9/2005 | Kao et al. | 134/1.1 |
| 2005/0285053 A1* | 12/2005 | Kuo et al. | 250/492.22 |
| 2006/0038554 A1* | 2/2006 | Kurita et al. | 324/158.1 |
| 2006/0051966 A1* | 3/2006 | Or et al. | 438/706 |
| 2006/0139583 A1* | 6/2006 | Wegmann et al. | 355/30 |
| 2006/0278165 A1* | 12/2006 | Ishikawa et al. | 118/719 |
| 2006/0286300 A1* | 12/2006 | Ishikawa et al. | 427/331 |
| 2007/0006936 A1* | 1/2007 | Hosokawa et al. | 141/8 |
| 2007/0040041 A1* | 2/2007 | Le et al. | 236/1 C |
| 2007/0077354 A1* | 4/2007 | O'Brien et al. | 427/248.1 |
| 2007/0157886 A1* | 7/2007 | Elgar et al. | 118/729 |
| 2007/0166133 A1* | 7/2007 | Lee et al. | 414/217 |
| 2007/0194228 A1* | 8/2007 | Frosien et al. | 250/309 |
| 2008/0066683 A1* | 3/2008 | Fujimura et al. | 118/724 |

* cited by examiner

SUBSTRATE SUPPORT ASSEMBLY WITH THERMAL ISOLATING PLATE

CROSS-REFERENCE TO RELATED APPLICATIONS

This application claims benefit of U.S. Provisional Application Ser. No. 60/722,127, filed Sep. 30, 2005, which is incorporated by reference in its entirety.

BACKGROUND OF THE INVENTION

1. Field of the Invention

The embodiments of the present invention generally relate to a substrate support having a thermal isolating plate, and more specifically, to a substrate support for a lithographic writing chamber.

2. Description of the Related Art

As the device density of integrated circuits continues to increase, critical dimensions of the structures defining those devices must be held to ever increasing tolerances. Thus, device manufacturing processes, such as lithographic writing of resist layers during mask formation, must be continually improved in order to define smaller features and insure device operation.

However, thermal influences during some fabrication steps make it difficult to maintain manufacturing tolerances. For example, during a lithographic writing process, an energy beam used to expose the photoresist heats the substrate. Additionally, the actuators utilized to maneuver the substrate during the writing process also generate heat. The heat causes the substrate and the substrate supporting structure to expand, which may inadvertently change the substrate's position. Thus, maintaining the accuracy and precision of lithographic writing processes is difficult at small critical dimensions. Errors during writing caused by thermal shifts may lead to poor device performance. Thus, it would be desirable to thermally isolate the substrate from the substrate support.

Therefore, there is a need for an improved substrate support.

SUMMARY OF THE INVENTION

The embodiments of the invention generally relate to a method and apparatus for thermally isolating a substrate from a substrate support. In one embodiment, a substrate support assembly is provided having a substrate support coupled to a temperature regulating plate An actuator adapted to laterally position the plate is coupled to the temperature regulating plate in a spaced-apart relation.

In another embodiment, a method for processing a substrate comprises positioning a substrate on a substrate support coupled to an actuator adapted to laterally position the plate, maintaining the plate at a predefined temperature during processing of the substrate and exposing a resist layer disposed on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
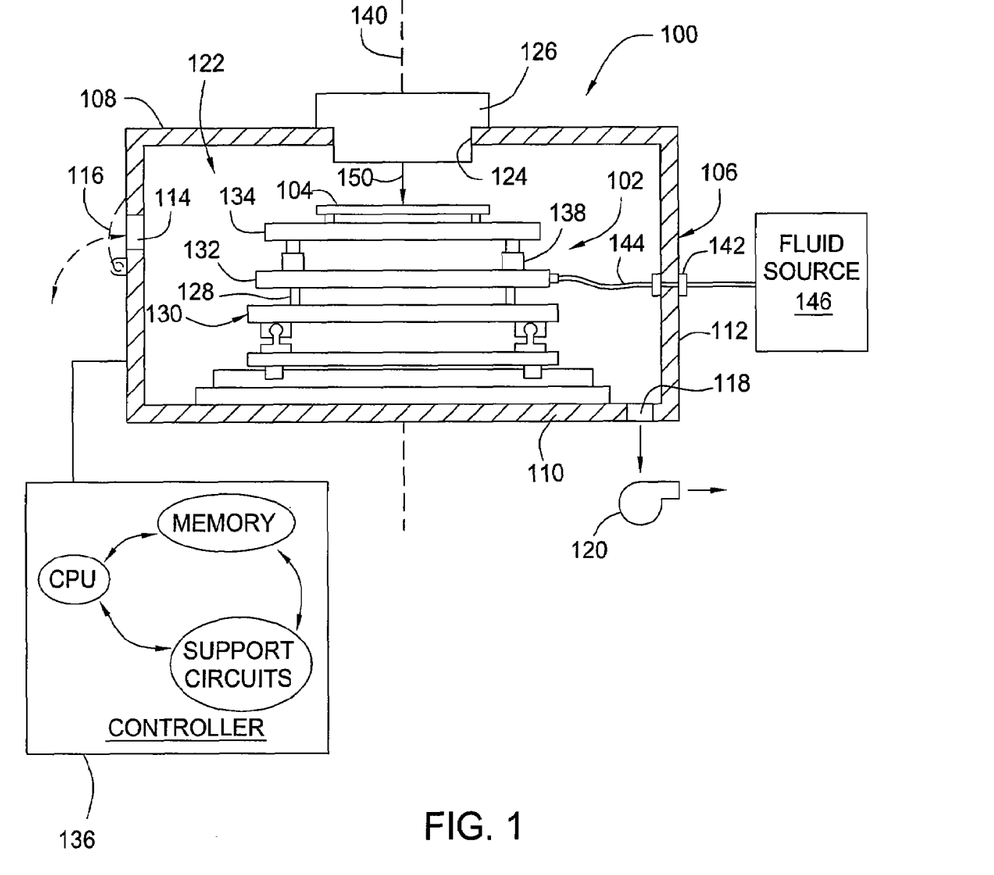
FIG. 1 is a cross-sectional view of one embodiment of a processing chamber.

FIG. 1 depicts one embodiment of a processing chamber 100 having a substrate support assembly 102 adapted to thermally isolate a substrate 104 therefrom. Although the substrate support assembly 102 is illustratively shown in a lithographic writing chamber supporting a reticle (e.g., a photomask), it is contemplated that the invention may be used to advantage in other processing chambers.

In the embodiment depicted in FIG. 1, the processing chamber 100 includes a chamber body 106 having a lid 108, bottom 110 and side walls 112. The chamber body 106 may be fabricated from aluminum, stainless steel or other suitable material. The side walls 112 of the chamber body 106 generally include one or more access ports 114, at least one of which is selectively sealed by a slit valve 116 (shown in phantom) to allow entry and egress of the substrate 104 from an interior volume 122 of the chamber body 106. The lid 108 is sealingly disposed on the side walls 112 of the chamber body 106. The lid 108 includes an aperture 124 having an energy beam generating device 126 sealingly mounted thereto. The energy beam generating device 126 may be utilized to selectively expose a resist layer disposed on the substrate 104, for example, with an electron beam, such that the resist layer may be patterned to form a mask utilized in a subsequent etch process. One chamber that may be adapted to benefit from the invention is an ALTA 4700 mask patterning system, available from Applied Materials, Inc., located in Santa Clara, Calif.

The substrate support assembly 102 is coupled to the bottom 110 of the chamber body 106. The substrate support assembly 102 includes a main actuator 130, a temperature regulating plate 132 and a substrate support 134. The main actuator 130 is coupled to a controller 136 and is configured to control the lateral position of the substrate support 134 relative to the energy beam generating device 126. The thermal regulating plate 132 is positioned between the substrate support 134 and the main actuator 130 and is configured to isolate heat generated by the actuator 130 from the substrate support 134, and to provide a heat sink for energy transferred from the substrate 104 during the writing process.

Figure 2:
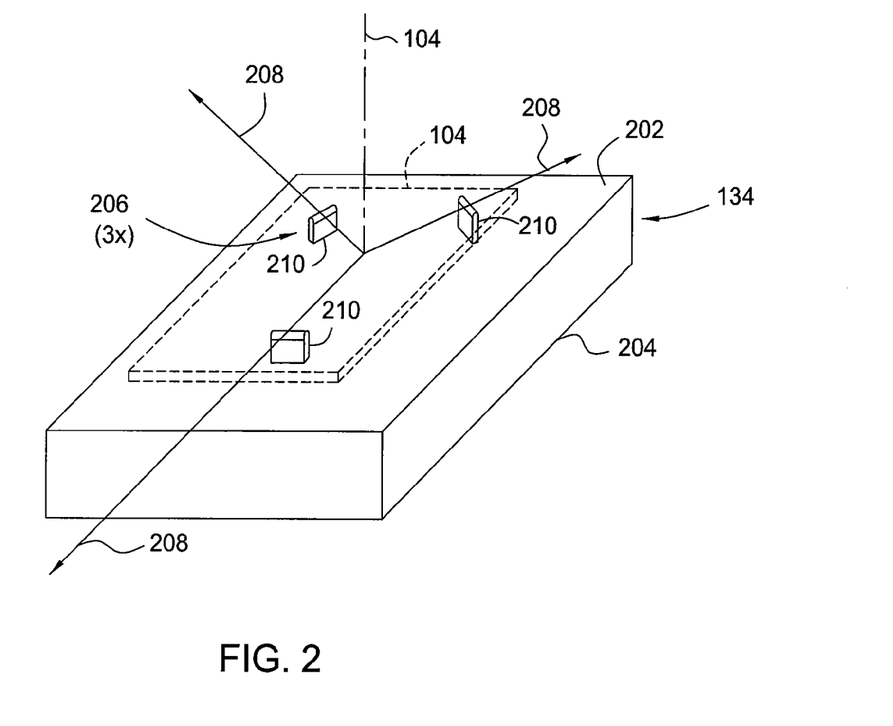
FIG. 2 is a perspective view of one embodiment of a substrate support assembly.

Referring additionally to the perspective view of the substrate support assembly depicted in FIG. 2, the substrate support 134 includes a top surface 202 adapted to support the substrate thereon and a bottom surface 204 facing the temperature control plate 132. The top surface 202 of the substrate support 134 may include a plurality of spacers 206 configured to maintain the substrate 104 (shown in phantom in FIG. 2) in a spaced-apart relation relative to the substrate support 134.

In one embodiment, the spacers 206 are a plurality of flexures 210 arranged to allow thermal expansion of the substrate 104 relative to the substrate support 134. For example, the flexures may be configured to allow movement in a radial direction defined from a central axis 140 of the substrate support, as depicted by arrows 208.

Figure 3:
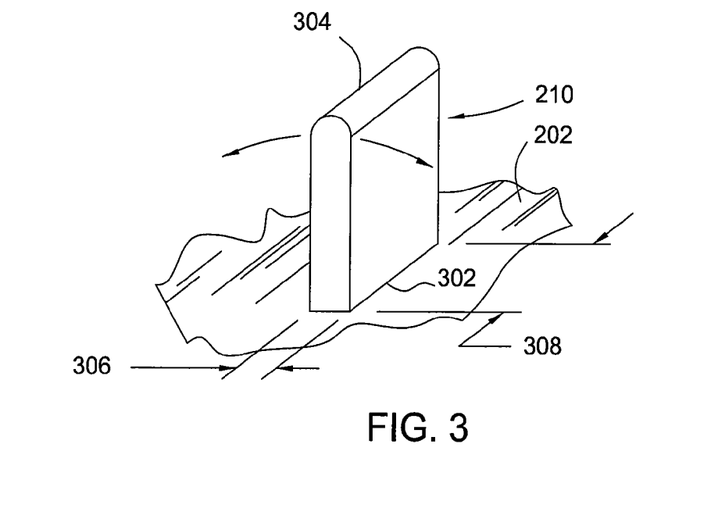
FIG. 3 is a perspective view of one embodiment of a flexure.

FIG. 3 depicts one embodiment of a flexure 210. The flexure 210 is coupled to the top surface 202 of the substrate support 134 at a first end 302 and extends away from the substrate support 134 to a second end 304. The second end 304 may be rounded or have a radius to reduce the potential for scratching the substrate positioned thereon. The flexure 210 generally has a thin thickness 306 relative to its width 308, thereby allowing the second end 304 of the flexure 210 to bend in a direction normal to the width 308, while being stable (i.e., relatively inflexible) in a direction normal to the thickness 306. In one embodiment, the flexures 210 are arranged in a polar array about the center line 140.

Referring back to FIG. 1, a plurality of spacers 138 maintain the substrate support 134 and thermal regulating plate 132 in a spaced-apart relation. In one embodiment, the spacers 138 are a plurality of actuators disposed between the bottom of the substrate support and the top of the temperature regulating plate. The actuators are arranged such that the inclination of the planar orientation of the top surface of the substrate support may be adjusted relative to the center line 140. In one embodiment, the actuators are piezo-electric actuators, although other suitable actuators or adjustment mechanisms may be utilized.

The bottom surface of the thermal regulating plate 132 is spaced from the main actuator 130 by a plurality of standoffs 128. The standoffs 128 minimize the conductive heat transfer path between the temperature regulating plate 132 and the main actuator 130.

Figure 4:
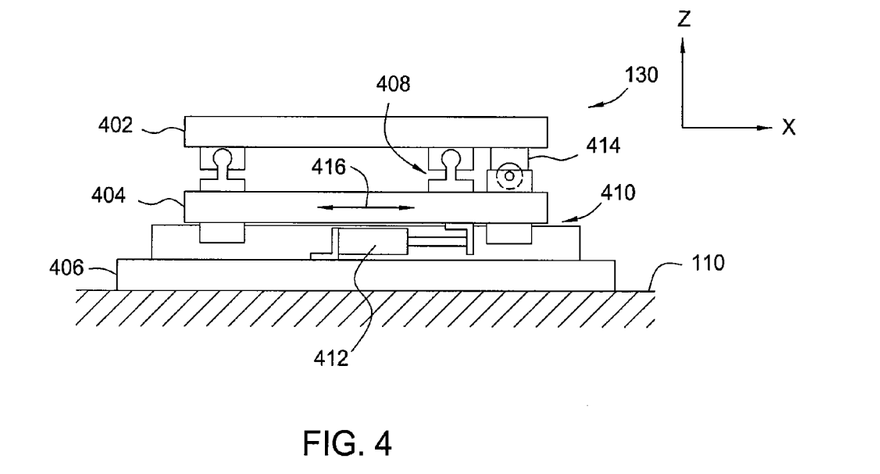
FIG. 4 is a front view of one embodiment of an actuator.
Figure 5:
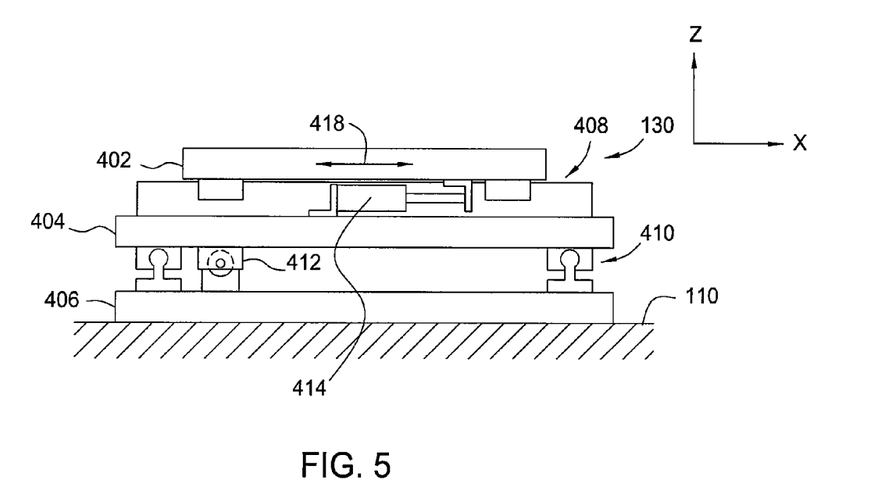
FIG. 5 is a side view of the actuator of FIG. 4.

FIGS. 4 and 5 depict one embodiment of the main actuator 130. The main actuator 130 generally includes a first stage 402, a second stage 404 and a base 406. The base 406 is coupled to the chamber bottom 110. A pair of linear bearings 410 couples the second stage 404 to the base 406. A first actuator 412 is coupled between the base 406 and the second stage 404 such that the second stage 404 may be selectively positioned in a first direction, as shown by arrow 416. The first actuator 412 may be an electric motor coupled to a lead screw, a motor coupled to a belt drive, or other suitable mechanism for positioning the stage.

The first stage 402 is coupled to the second stage 404 by a second pair of linear bearings 408. A second actuator 414 is coupled between the first and second stages 402, 404 such that the position of the first stage 402 may be controlled relative to the second stage 404 in a second direction, as shown by arrow 418. The second linear bearings 408 are orientated perpendicular to the first linear bearings 410 such that by selectively actuating the first and second actuators 412, 414, the position of the first stage 402 may be controlled in a plane substantially perpendicular to the center axis 140 of the processing chamber 100.

Figure 6:
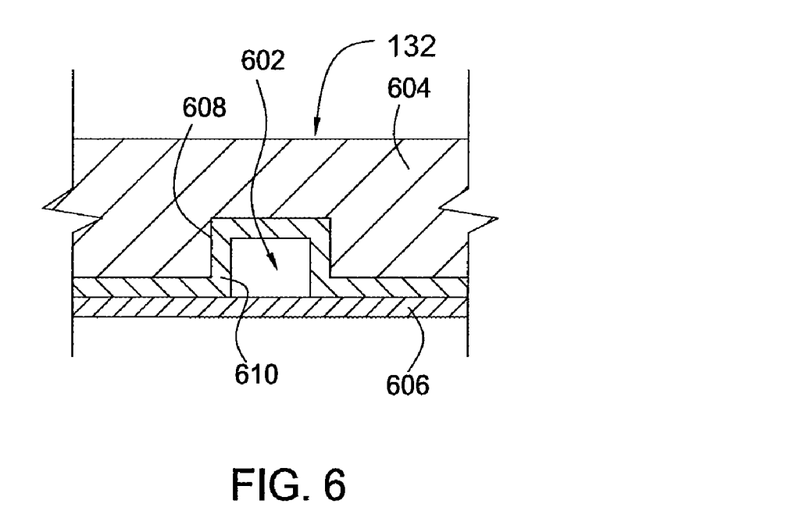
FIG. 6 is a partial sectional view of one embodiment of a temperature control plate.
Figure 7:
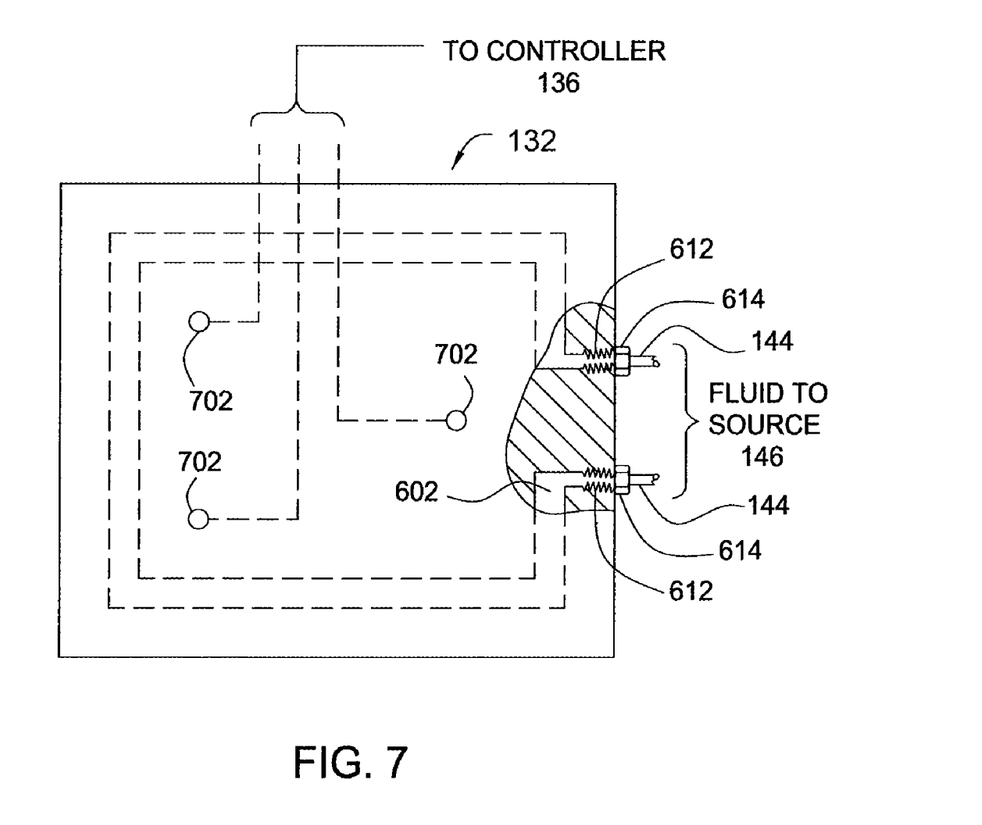
FIG. 7 is a top view of a temperature regulating plate.

FIGS. 6-7 depict one embodiment of the temperature regulating plate 132. The temperature regulating plate 132 is generally fabricated from a thermally conductive material, such as a metal, for example, aluminum. In the embodiment depicted in FIGS. 6-7, the temperature regulating plate 132 includes at least one conduit 602 for circulating a heat transfer fluid therethrough. The conduit 602 may be coupled to the exterior of the plate or formed in the plate 130. In the embodiment depicted in FIG. 6, the conduit 602 is formed between a top plate 604 and a bottom plate 606.

At least a portion of the conduit 602 may be coated and/or fabricated from a material selected to enhance the heat transfer between the fluid circulating in the conduit 602 and the thermal regulating plate 132. Heat transfer may be enhanced by coating and/or forming at least a portion of the conduit from a material having a coefficient of thermal conductivity greater than the first plate. In another embodiment, the material coating and/or forming at least a portion of the conduit may be fabricated from a material that prevents oxides from forming on the inside walls of the conduit 602.

In the embodiment depicted in FIG. 6, at least a portion of the conduit 602 is defined by a groove 608 formed in the first plate 604. The first plate 604 is fabricated from aluminum or other good thermal conductor. The groove 608 is lined with a heat transfer enhancing material 610, such as copper. The second plate 606 is coupled to the first plate 604 to enclose the groove 608, thereby forming the conduit 602. The second plate 606 may be made, or coated with, aluminum, copper or other heat transfer enhancing material.

Each end of the conduit 602 includes a port 612 adapted to receive a fitting 614. The fitting 614 facilitates coupling a flexible tube 144 to a port 142 formed through the chamber body 106. The ports 142 are coupled by the tubes 144 to a heat transfer fluid source 146 disposed outside the chamber body 106, as depicted in FIG. 1. The flexible tubes 144 allow the main actuator 130 to laterally position the substrate support 134 without disruption of fluid flow through the thermal regulating plate 132. It is contemplated that the fluid may be routed through another part of the body 106.

Referring to FIG. 7, a plurality of temperature sensors 702 are disposed on the top surface of the thermal regulating plate 132. The sensors 702 provide a metric indicative of the temperature of the plate 132. The spacing of the sensors 702 are selected to provide information suitable for determining temperature gradients within the thermal regulating plate 132. The metric is provided to the controller 136 to provide real time feedback relating to the temperature of the plate 132. Utilizing information provided by the sensors 702, the temperature of the thermal regulating plate 132 may be readily determined, even when the plate 132 is subjected to changes in the heat flux between substrate support 134 and thermal regulating plate 132 (during the writing operations), and/or changes in the heat flux between main actuator 130 and thermal regulating plate 132 (generated by the energization of main actuators 130).

Figure 8:
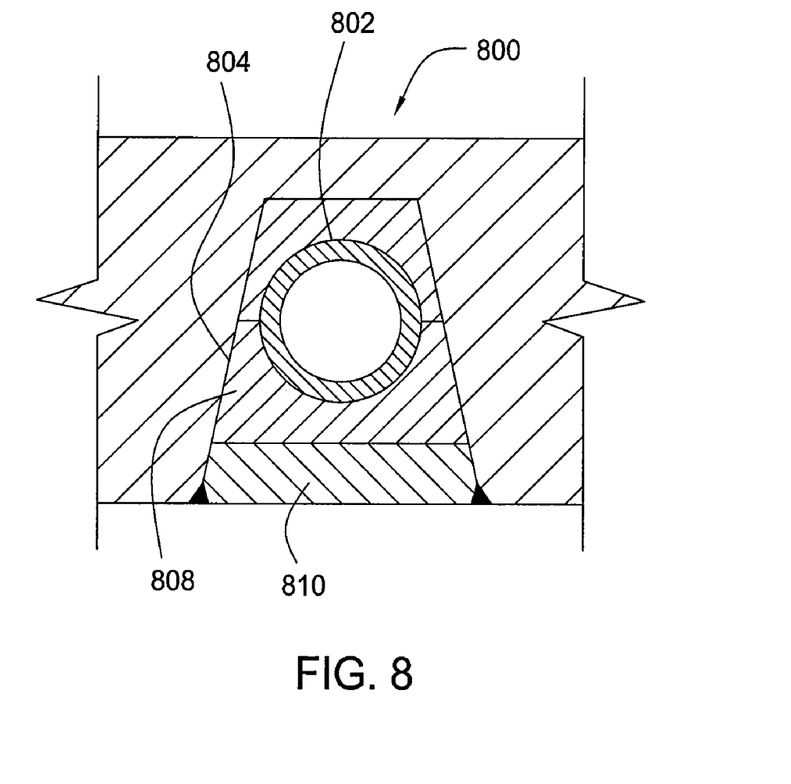
FIG. 8 is a bottom view of another embodiment of a temperature regulating plate.

FIG. 8 depicts a partial sectional view of a conduit 802 formed in another embodiment of a thermal regulating plate 800. In the embodiment depicted in FIG. 8, the thermal plate 800 includes a groove 804 formed in at least one side of the plate 800. The fluid conduit 802 is disposed in the groove 804 and surrounded by a malleable heat sink material 808. The malleable material 808 is pressed into the groove 806 such that the malleable material 808 intimately contacts the walls of the groove 804 and the conduit 802, thereby providing a good heat transfer path therebetween. The heat sink material 308 may be comprised of two or more elements to facilitate circumscribing the conduit 802. A plug 810 may be disposed in the groove to seal the malleable material and conduit therein. In one embodiment, the plug 810 is a strip of aluminum continually welded to the plate 800.

Figure 9:
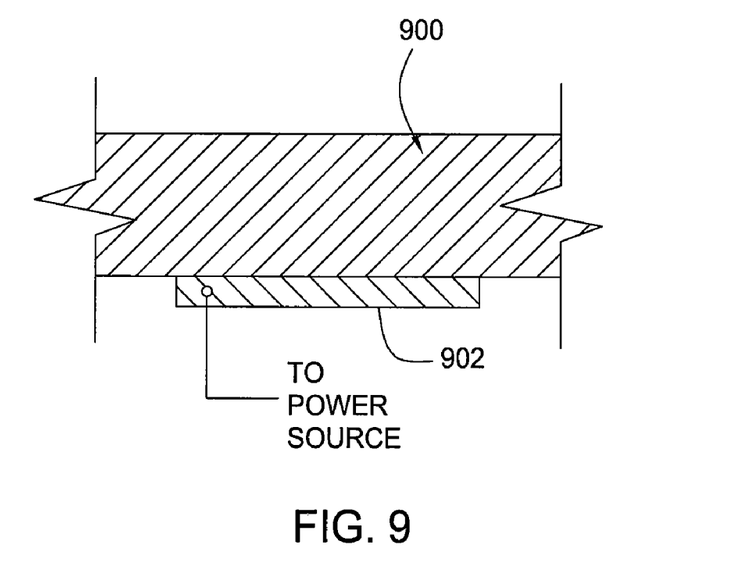
FIG. 9 depicts a partial sectional view of another embodiment of a thermal regulating plate.

FIG. 9 depicts a partial sectional view of another embodiment of a thermal regulating plate 900. The thermal regulating plate 900 may optionally include one or more conduits, as described above, for flowing heat transfer fluid therethrough. The heat transfer plate depicted in FIG. 9 includes a thermal electric device 902 suitable for heating and/or cooling the plate. In one embodiment, the thermal electric device 902 is Peltier device, such as available from Marlow Industries. In yet another embodiment, the thermal electric device is a resistive heater coupled to the plate. By controlling the power and/or polarity applied to the device 902, the plate 900 may be heated and/or cooled in a manner that maintains the plate 900 at a predefined temperature.

Referring primarily to FIG. 1 for an operational description of the processing chamber 100, a substrate 104, such as a rectangular quartz workpiece to be fabricated into a photomask reticle, is disposed on the substrate support assembly 102. The main actuator 130 is selectively energized to position the substrate 104 such that discrete portions of the substrate are selectively exposed to and energized by a beam of energy, for example, an electron or laser beam, generated by the energy beam generating device 126. As the main actuator 130 moves the substrate support 134, the sensors 702 detect any increase or change in temperature of the thermal regulating plate 132 that may be generated by the main actuator 130 or the energy beam generating device 126. This temperature information is utilized by the controller 136 to adjust the temperature and/or rate of heat transfer fluid passing through the conduit 602 of the thermal regulating plate 132, thereby maintaining the temperature of the thermal regulating plate 132 at a predefined value. Thus, heat generated by the main actuators 130 is prevented from reaching the substrate 104 where expansion could detrimentally affect the precision and accuracy of writing operations. Moreover, as the temperature of the thermal regulating plate 132 is maintained substantially constant during the processing of the substrate 104, thermal expansion of the substrate support assembly 102, which may also adversely affect the precision of substrate processing, is minimized. The flexures, spacers and actuators maintaining the substrate support 134, thermal regulating plate 132 and main actuator 130 in a respective spaced-apart relation, further contribute to thermally isolating the substrate 104 from the substrate support assembly 102, thereby further enhancing the precision of the lithographic writing process.

What is claimed is:

1. A substrate support assembly comprising:
   a substrate support plate;
   a thermal regulating plate coupled in a spaced-apart relation to the substrate support plate; and
   a main actuator coupled in a spaced-apart relation to the thermal regulating plate, wherein the main actuator is adapted to move the substrate support plate laterally.

2. The substrate support assembly of claim 1, further comprising:
   a plurality of actuators disposed between the thermal regulating plate and the substrate support plate.

3. The substrate support assembly of claim 2, wherein the plurality of actuators may be independently actuated to control the inclination of the substrate support plate.

4. The substrate support assembly of claim 1, wherein the thermal regulating plate further comprises:
   a conduit adapted to flow a heat transfer fluid therein.

5. The substrate support assembly of claim 4, wherein the conduit is formed in the thermal regulating plate.

6. The substrate support assembly of claim 5, wherein the conduit is at least one of lined with or fabricated from a heat transfer enhancing material.

7. The substrate support assembly of claim 1, wherein the thermal regulating plate further comprises:
   a first plate coupled to a second plate; and
   a conduit at least partially formed in at least one of the first or second plates.

8. The substrate support assembly of claim 7, wherein the first plate further comprises:
   a groove defining at least a portion of the conduit, wherein the second plate covers the groove.

9. The substrate support assembly of claim 8, further comprising:
   a heat transfer enhancing material disposed in the groove.

10. The substrate support assembly of claim 1, wherein the thermal regulating plate further comprises:
    a groove; and
    a conduit disposed in the groove.

11. The substrate support assembly of claim 1, wherein the thermal regulating plate further comprises:
    a thermal electric device.

12. A processing chamber comprising:
    a chamber body having a lid enclosing an internal volume;
    a substrate support disposed in the internal volume of the chamber body;
    a thermal regulating plate coupled in a spaced-apart relation to the substrate support;
    a main actuator coupled in a spaced-apart relation to the thermal regulating plate, wherein the main actuator is adapted to move the substrate support laterally; and
    an energy beam generating device positioned above the substrate support plate and configured to direct an energy beam at a substrate positioned on the substrate support.

13. The processing chamber of claim 12, wherein the thermal regulating plate further comprises:
    a conduit adapted to flow a heat transfer fluid therein.

14. The processing chamber of claim 13, wherein the conduit is formed in the thermal regulating plate.

15. A processing chamber comprising:
    chamber body having a lid enclosing an internal volume;
    a substrate support disposed in the internal volume of the chamber body;
    a thermal regulating plate coupled in a spaced-apart relation to the substrate support, the thermal regulating plate comprising a conduit formed therein to flow a heat transfer fluid, wherein the conduit is at least one of lined with or fabricated from a heat transfer enhancing material;
    a main actuator coupled in a spaced-apart relation to the thermal regulating plate, wherein the main actuator is adapted to move the substrate support; and
    an energy beam generating device positioned above the substrate support plate and configured to direct an energy beam at a substrate positioned on the substrate support.

16. The processing chamber of claim 12, wherein the thermal regulating plate further comprises:
    a first plate coupled to a second plate; and
    a conduit at least partially formed in at least one of the first or second plates.

17. A processing chamber comprising:
    a chamber body having a lid enclosing an internal volume;
    a substrate support disposed in the internal volume of the chamber body;

a thermal regulating plate coupled in a spaced-apart relation to the substrate support, the thermal regulating plate comprising a first plate coupled to a second plate and a conduit at least partially formed in at least one of the first or second plates, wherein the first plate comprises a groove defining at least a portion of the conduit, and wherein the second plate covers the groove;

a main actuator coupled in a spaced-apart relation to the thermal regulating plate, wherein the main actuator is adapted to move the substrate support; and an energy beam generating device positioned above the substrate support plate and configured to direct an energy beam at a substrate positioned on the substrate support.

18. The processing chamber of claim 17, further comprising:

a heat transfer enhancing material disposed in the groove.

19. The processing chamber of claim 12, wherein the thermal regulating plate further comprises:

a thermal electric device.

20. A processing chamber comprising:

a chamber body having a lid enclosing an internal volume;

a thermal regulating plate disposed in the internal volume of the chamber body;

at least one sensor positioned to provide a metric indicative of a temperature of the thermal regulating plate;

a substrate support disposed below the lid and coupled in a spaced-apart relation to the thermal regulating plate;

a main actuator disposed in the internal volume of the chamber body and coupled in a spaced-apart relation to the thermal regulating plate, the main actuator configured to selectively position the substrate support laterally below the lid;

a plurality of actuators disposed between the thermal regulating plate and the substrate support; and an energy beam generating device positioned above the substrate support plate and configured to direct an energy beam at a substrate positioned on the substrate support.

* * * * *

UNITED STATES PATENT AND TRADEMARK OFFICE
CERTIFICATE OF CORRECTION

PATENT NO. : 7,470,919 B2 Page 1 of 1
APPLICATION NO. : 11/537163
DATED : December 30, 2008
INVENTOR(S) : Elgar et al.

It is certified that error appears in the above-identified patent and that said Letters Patent is hereby corrected as shown below:

In the Claims:

Column 6, Claim 15, Line 43, please insert --a-- before chamber.

Signed and Sealed this

Twenty-first Day of April, 2009

JOHN DOLL
*Acting Director of the United States Patent and Trademark Office*